United States Patent [19]
Hartig et al.

[11] Patent Number: 5,683,548
[45] Date of Patent: Nov. 4, 1997

[54] INDUCTIVELY COUPLED PLASMA REACTOR AND PROCESS

[75] Inventors: Michael J. Hartig; John C. Arnold, both of Austin, Tex.

[73] Assignee: Motorola, Inc., Schaumburg, Ill.

[21] Appl. No.: 605,697

[22] Filed: Feb. 22, 1996

[51] Int. Cl.$^6$ ........................................... H05H 1/00
[52] U.S. Cl. .............. 156/643.1; 156/345; 118/723 I; 118/723 IR; 427/569
[58] Field of Search .................. 156/345, 643.1; 218/68; 118/723 I, 723 IR, 723 R; 427/569

[56] References Cited

U.S. PATENT DOCUMENTS

| | | | |
|---|---|---|---|
| 4,525,382 | 6/1985 | Sugioka | 427/54.1 |
| 5,091,049 | 2/1992 | Campbell et al. | 156/345 X |
| 5,134,965 | 8/1992 | Tokuda et al. | 156/345 X |
| 5,269,847 | 12/1993 | Anderson et al. | 118/723 R X |
| 5,356,515 | 10/1994 | Tahara et al. | 156/643.1 |

FOREIGN PATENT DOCUMENTS

| | | | |
|---|---|---|---|
| 0 456 422 A2 | 6/1991 | Germany | H04H 1/42 |

OTHER PUBLICATIONS

Yasui, Toshiaki et al., "Electron cyclotron resonance plasma generation using a planar ring–cusp magnetic field and a reetrant coaxial cavity," Jul./Aug. 1995, pp. 2105–2109.

Francombe, Maurice H. et al., "Physics of Thin Films," vol. 18, 1994, pp. 1–59.

Yamada, N. et al., "Simulations of Schemes for Feedback and Optimal Control of Etch Rate and Uniformity in Inductively Coupled Plasma Sources," Oct. 1995, 48 pages.

Ventzek, P. L. G. et al., "Simulations of Real–Time Two–Coil Control of an Inductively Coupled Plasma Source For Etching Applications," Abstract No. 121, pp. 187–188.

*Primary Examiner*—Thi Dang

[57] ABSTRACT

An inductively coupled plasma reactor and method for processing a semiconductor wafer (28). The inductively coupled plasma reactor (10) includes a plasma source (16) having a plurality of channels (38, 44) in which processing gases are independently supplied to each channel. A gas supply system (20) includes a plurality of gas feed lines (34, 35, 36) each capable of supplying an individual flow rate and gas composition to the plurality of channels (38, 44) in the plasma source (16). Each channel is surrounded by an independently powered RF coil (54, 56), such that the plasma density can be varied within each channel (38, 44) of the plasma source (16). In operation, a material layer (66) overlying a semiconductor wafer (28) is either uniformly etched or deposited by localized spatial control of the plasma characteristics at each location (64) across the semiconductor wafer (28).

28 Claims, 4 Drawing Sheets

INDUCTIVELY COUPLED PLASMA REACTOR AND PROCESS

FIELD OF THE INVENTION

This invention relates in general to a plasma process technology, and more particularly, to inductively coupled plasma systems and to associated etching and deposition processes.

BACKGROUND OF THE INVENTION

As semiconductor device technology grows in complexity, more and more device functions are incorporated into smaller and smaller device geometries. Device manufacturers require sophisticated processing apparatus to meet the demands for high precision device ulta-large-scale-integrated (ULSI) device fabrication. However, processing costs correspondingly increase with the complexity of the processing equipment, and the equipment becomes more expensive to purchase and to maintain. To address the increased production costs, manufacturers increase the size of semiconductor substrates upon which integrated circuit devices are formed. By increasing the substrate size the unit cost of production can be reduced. Today, semiconductor wafers having diameters of 8" or more are common in state-of-the-art fabrication facilities. While the increased wafer diameters have enabled manufacturers to fabricate large numbers of devices on a single substrate, great difficulty can be experienced controlling the uniformity of fabrication processes applied to large diameter semiconductor wafers.

In the plasma etching process, many factors can impact the uniformity of etching a material layer deposited on the surface of a semiconductor wafer. These factors include the plasma uniformity, the ion flux uniformity at the wafer surface, the reactant gas supply to the etching system, and the removal of reaction products across the surface of the wafer. Traditional plasma etching reactors are designed primarily with one power source, in which to create the plasma, and one injection point to introduce process gases. By limiting the system to a single power source and gas supply, the etching systems ability to optimize the etch rate Uniformity of the process across a large diameter wafer is very minimal. For example, there is virtually no way in which to spatially vary the etching process across the surface of the semiconductor wafer. Additionally, plasma etching systems are typically provided with a processing chamber having a fixed arrangement of components. Because the chamber design can effect the etching characteristics of specific thin-film materials commonly used in semiconductor fabrication, the particular chamber arrangement dictates that the etching system must be limited to etching only one type or only a few different types of material.

Advanced etching technology, such as electron-cyclotron-resonance (ECR) etching and inductively-coupled-plasma (ICP) etching has been developed to etch semiconductor devices having extremely small feature sizes. These systems operate at much lower pressure than diode systems yet are capable of generating a high density plasma. Systems such as ECR and ICP etching systems also offer an advantage over conventional diode etching systems by eliminating the exposure of the semiconductor substrate to high electrical fields. By decoupling the substrate from the plasma generating elements of the reactor, ion transport efficiency and ion anisotropy can be enhanced yielding greater process control.

In plasma deposition technology, similar uniformity limitations exist as wafer diameters increase. Better deposition uniformity is usually achieved at extremely low operating pressure. However, at low pressure, high density plasmas are required to deposit a thin-film layer on a large diameter substrate having a uniform thickness.

At present, neither plasma etching systems nor plasma deposition systems offer any means of spatially varying the plasma to address etching and deposition uniformity with large diameter semiconductor substrates. Accordingly, further development of reactor design and etching process technology is necessary to uniformly etch material layers overlying large diameter semiconductor wafers.

SUMMARY OF THE INVENTION

In practicing the present invention there is provided an inductively coupled plasma reactor and a process for either etching or depositing a material layer using the inductively coupled plasma reactor. The plasma reactor of the invention contains a coaxial multiple coil plasma source mounted within a reaction chamber. The plasma source is in spaced relationship with a chuck configured for accepting and supporting a semiconductor wafer thereon. The plasma source includes a plurality of channels, each channel having an independently controlled gas supply and an independently controlled RF coil surrounding the channel.

In operation, a semiconductor wafer is placed on the chuck and a gas control system is actuated to charge the reactor with plasma-forming gas. RF power is applied to the independent RF coils and the plasma is ignited within the chamber. The material layer is etched while controlling the etching uniformity by adjusting the RF power and frequency in the coil surrounding each channel, and the gas flow rate and the gas composition emerging from each of the channel within the plasma source. In the same manner, a material layer is deposited onto a substrate while spatially controlling the plasma density and composition. Highly precise and uniform etching and deposition is obtained by independently controlling the plasma density and composition in correspondence with the radial distance along the surface of a semiconductor wafer.

It will be appreciated that for simplicity and clarity of illustration, elements shown in the FIGURES have not necessarily been drawn to scale. For example, the dimensions of some of the elements are exaggerated relative to

DETAILED DESCRIPTION OF PREFERRED EMBODIMENTS

The present invention is for an inductively coupled plasma reactor in which the plasma density and composition can be spatially varied within the plasma reactor. To achieve a spatial variance in the plasma density and composition, a coaxial multiple coil inductive plasma source is provided having a variable number of recessed channels. Each channel is surrounded by an independently powered RF coil and contains a process gas orifice. Gas control mechanisms are provided such that the process gas flow rate and composition can be independently varied in each channel within the plasma source.

The present invention also contemplates a process in which a material layer is deposited or etched. In the etching process, the semiconductor wafer is placed on a chuck mounted within the plasma reaction chamber. The chuck is mounted in spaced relationship with the plasma source, such that the center of the semiconductor wafer is opposite the central channel in the plasma source. By positioning the semiconductor wafer relative to the channel configuration of the plasma source, the variable plasma density and composition generated by the plasma source results in localized control of the etch rate across the semiconductor wafer. Thus, the etch rate of a material layer overlying a semiconductor wafer can be independently varied across the diameter of the semiconductor wafer.

In the deposition process, the semiconductor wafer is positioned on the chuck, and a material layer is deposited onto the semiconductor wafer. The positional correspondence with the plasma source enables a uniformly thick material layer to be deposited by varying the plasma density and composition across the diameter of the semiconductor wafer.

Through the localized control of process gas flow rate and composition, together with the localized control of RF power density and frequency, the inductively coupled plasma reactor of the invention permits an enhanced degree of process parameter control during an etching process. Furthermore, the inventive reactor and process provide a means for high precision control of etch rates or deposition thickness of material layers overlying substrates of large diameter. Accordingly, semiconductor wafers having large diameters can be uniformly processed through fie localized plasma density control provided by the present invention.

Figure 1:
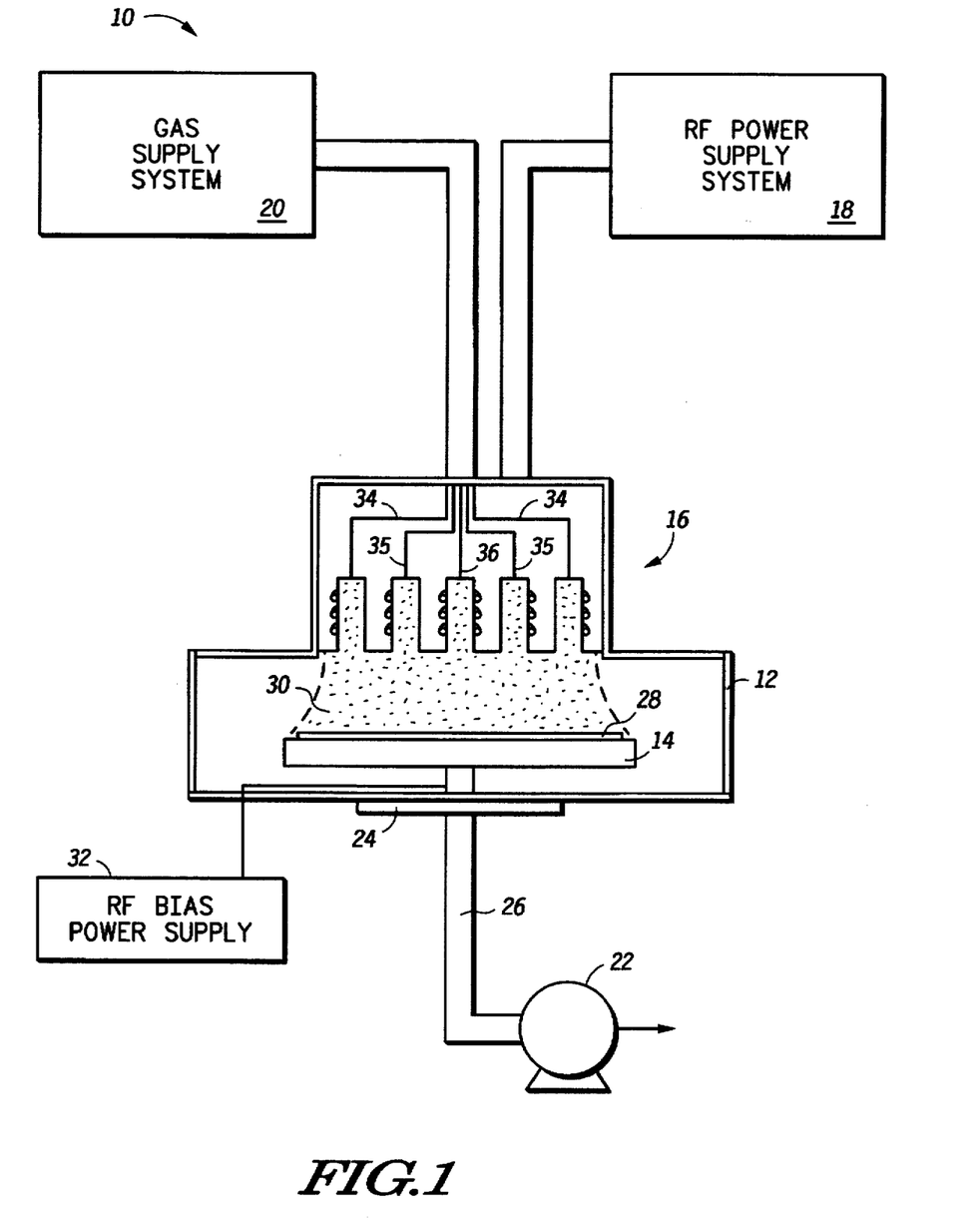
FIG. 1 is a schematic diagram of an inductively coupled plasma reactor arranged in accordance with one embodiment of the invention.

Shown in FIG. 1 is an ICP reactor 10. Inductively coupled plasma reactor 10 includes a processing chamber 12 housing a chuck 14. A plasma source 16 resides in an upper portion of processing chamber 12 in opposed spatial relationship to chuck 14. Processing chamber 12 is supplied with RF power from an RF power supply system 18. As will subsequently be described, RF power supply system 18 contains a plurality of independent RF power supply generators each capable of operating at an independent power level and frequency. Processing chamber 12 is also supplied with processing gases from a gas supply system 20. As will subsequently be described, gas supply system 20 is capable of supplying processing gas to processing chamber 12 in multiple independent gas feed lines. Vacuum pressure within processing chamber 12 is controlled by vacuum system 22. Reaction products and processing gases are withdrawn from processing chamber 12 through vacuum panel 24, which in a preferred arrangement, resides in processing chamber 12 below chuck 14 and coupled to vacuum line 26. Those skilled in the art will appreciate that other processing chamber designs are possible and that different vacuum port arrangements are possible. In addition, temperature control of chuck 14 can be provided by a cooling system (not shown). Either liquid or gas coolant can be transported through cooling channels embedded in chuck 14.

In operation, a semiconductor wafer 28 is placed on chuck 14 and processing gases are introduced into processing chamber 12 from gas supply system 20. A desired vacuum pressure is obtained within processing chamber 12 by vacuum system 22 and RF power is applied from RF power supply system 18 igniting a plasma 30. In the case of plasma etching, the bombardment energy of ionized species within plasma 30 upon semiconductor wafer 28 is further controlled by applying an RF bias to chuck 14 from RF bias power supply 32.

Figure 2:
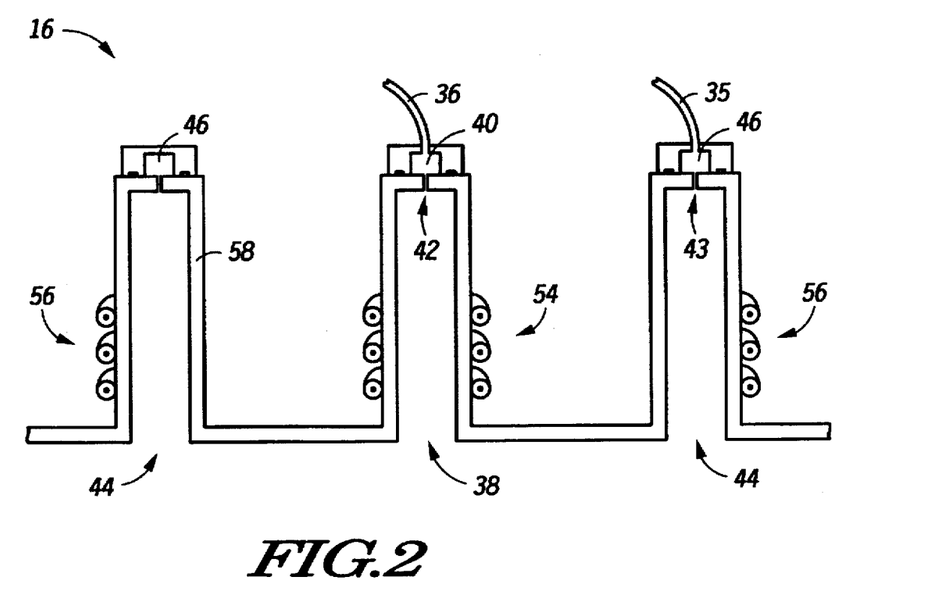
FIG. 2 illustrates, in cross-section, a portion of a plasma source arranged in accordance with the invention.

As depicted in FIG. 1, plasma source 16 contains numerous channels with each channel supplied by independent gas feed lines 34, 35, and 36. FIG. 2 illustrates a portion of plasma source 16 in exploded cross-sectional view. Gas feed line 36 supplies central channel 38 through an inner gas plenum 40. A gas orifice 42 provides communication between central channel 38 and inner gas plenum 40. Similarly, gas feed line 35 supplies processing gases to first channel 44 through an outer gas plenum 46.

Figure 3:
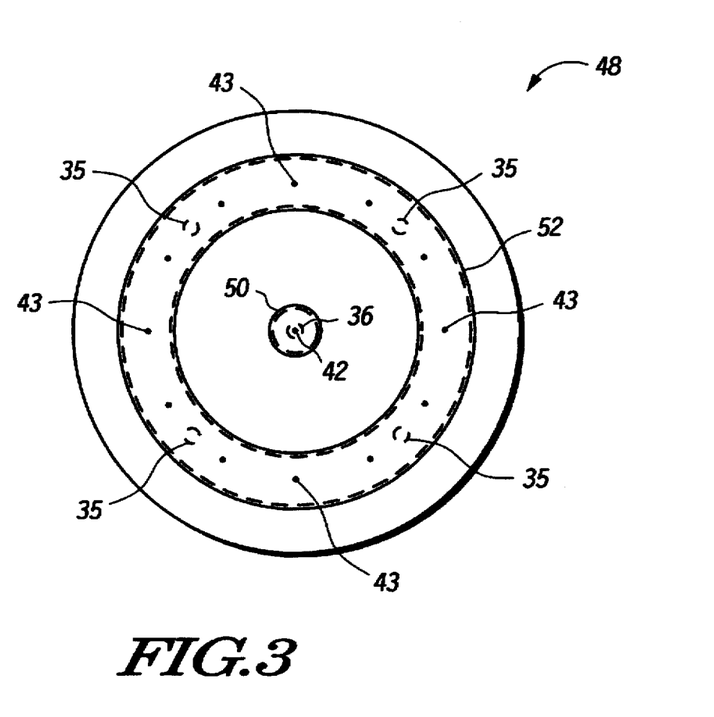
FIG. 3 illustrates a top view of a gas plenum suitable for delivery of process gases to the plasma source of the invention.

Processing gases are distributed to central channel 38 and first channel 44 through a circular plenum cap 48, shown in top view in FIG. 3. Plenum cap 50 houses inner gas plenum 40 distributing gas to central channel 38. Correspondingly, plenum cap 52 distributes gas to outer gas plenum 46. Gas feed line 36 is attached to plenum cap 50 in a central portion thereof. Gas feed line 35 can be attached to plenum cap 52 at numerous sites, as illustrated in FIG. 3. Similarly, gas orifice 43 is provided at numerous locations around the circular geometry of first channel 44.

As illustrated in FIGS. 2 and 3, first channel 44 is concentric about central channel 38. In one embodiment of the present invention, additional channels within plasma source 16 are also concentrically arranged about central channel 38 and first channel 44. For example, the outer most channel illustrated in FIG. 1 is concentric about first channel 44. By successive concentric arrangement, numerous channels can be configured within plasma source 16 depending upon the desired degree spatial control of plasma 30.

As illustrated in FIG. 2, a central RF coil 54 surrounds central channel 38. Additionally, a first RF coil 56 surrounds first channel 44. Both central RF coil 54 and first RF coil 56 are independently controlled by RF power supply system 18. Each RF coil can supply an independent power level and RF frequency to the processing gases within the enclosed channel. RF coils 54 and 56 are separated from the processing gases within each channel by a dielectric housing 58. Electrical current traversing the RF coils inductively couples with processing gas species to ignite a plasma within each channel. Those skilled in the art will recognize that by independently powering each RF coil and by independently supplying each channel with processing gases that the plasma density and composition can be independently adjusted in each channel within plasma source 16.

Figure 4:
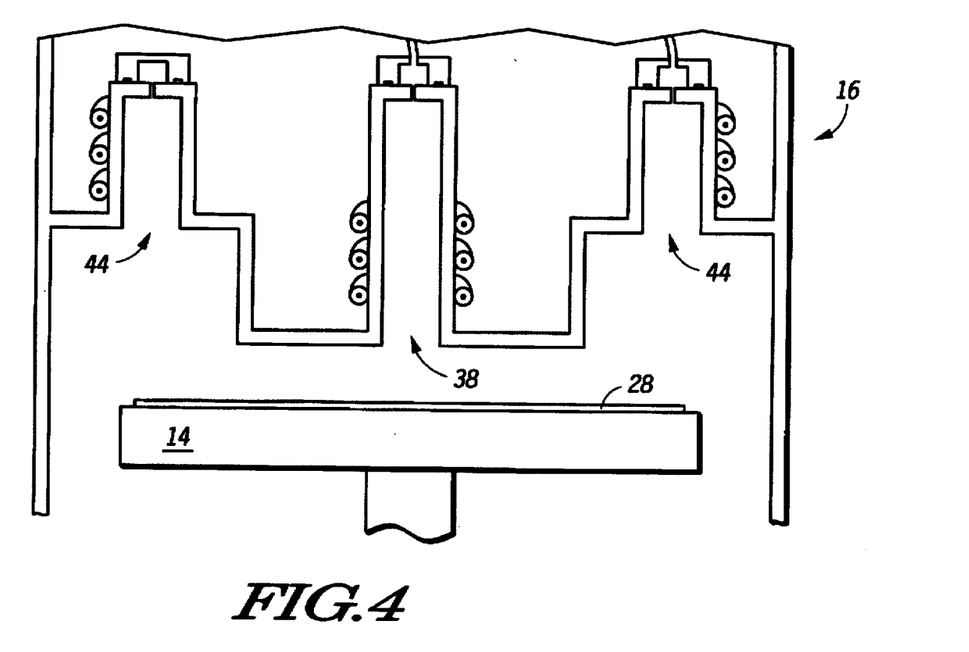
FIG. 4 illustrates, in cross-section, an alternate embodiment of a plasma source used in the inductively coupled plasma reactor illustrated in FIG. 1.
Figure 5:
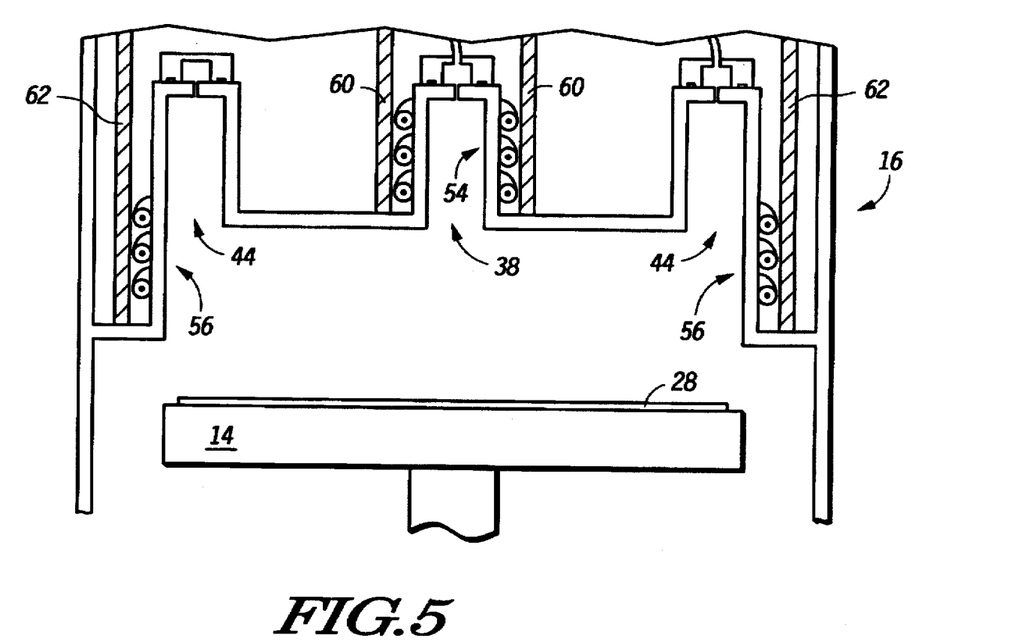
FIG. 5 illustrates in cross-section, a further embodiment of a plasma source suitable for use in the inductively coupled plasma reactor shown in FIG. 1.

Although the concentric channel design of plasma source 16 provides a substantial degree of control by which the plasma density and composition can be locally varied, additional embodiments of an ICP reactor designed in accordance with the invention are illustrated in FIGS. 4 and 5. The plasma conditions experienced by semiconductor wafer 28 can be further controlled by varying the separation distance between portions of plasma source 16 and the surface of semiconductor wafer 28. As illustrated in FIG. 4, central channel 38 is in close proximity to semiconductor wafer 28, while first channel 44 is vertically separated from semiconductor wafer 28.

An alternate configuration is illustrated in FIG. 5. In this embodiment of the invention, central channel 38 is vertically separated from semiconductor wafer 28 a greater distance than first channel 44. By varying the vertical separation distance between components of plasma source 16 and the semiconductor wafer being etched, an additional degree of control is provided for varying the plasma conditions across the surface of the semiconductor wafer. Furthermore, the variable plasma conditions can be combined with varying degrees of RF bias applied to chuck 14 to enable even more precise control of ion bombardment upon semiconductor wafer 28.

In a further embodiment of the invention, RF shields are positioned outside of each coil in plasma source 16. As illustrated in FIG. 5, a central RF shield 60 surrounds central RF coil 54, and a first RF shield 62 surrounds first RF coil 56. RF shields 60 and 62 minimize the RF interference between the independently powered coils in plasma source 16. The RF shields can be constructed from a conductive material such as aluminum, or alternatively a high-permeability, ferromagnetic material, such as a ferrite material.

Through the selection of proper materials of construction, RF shields 60 and 62 can enhance the magnetic field within each channel by confining the magnetic field to the immediate region of the RF coils that they surround. Although shields 60 and 62 are depicted in the particular ICP reactor embodiment illustrated in FIG. 5, those skilled in the art will appreciate that shields 60 and 62 can be similarly incorporated into any of the plasma source configurations contemplated by the present invention.

The process control capability of the ICP reactor of the invention as applied to the etching of a material layer on a semiconductor substrate will now be described. Shown in FIG. 6, in top view, is a generalized depiction of semiconductor wafer 28. Semiconductor wafer 28 has a generally circular geometry characterized by a radius "R" and by a perimeter "P." Semiconductor wafer 28 can be further characterized by a plurality of locations 64 positioned on the surface of semiconductor wafer 28 and specified by a radial distance. The radial distance varies from zero to the radial distance of perimeter P.

Figure 7:
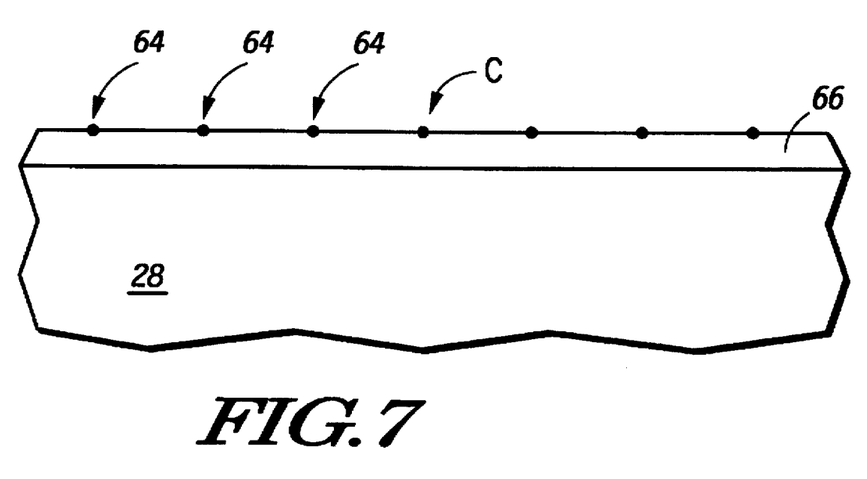
FIG. 7 illustrates, in cross-section, a portion of a semiconductor wafer having an overlying material layer to be etched in the inductively coupled plasma reactor of the invention.

FIG. 7 illustrates, in cross-section, a portion of semiconductor wafer 28. A material layer 66 overlies the surface of semiconductor wafer 28. The process of the present invention contemplates the removal of many different kinds of materials commonly used in the fabrication of integrated circuit devices. For example, material layer 66 can be a semiconductor material, such as polycrystalline silicon, or a refractory metal silicide, or the like. Additionally, material layer 66 can be a conductive material, such as aluminum, aluminum alloyed with silicon, aluminum alloyed with silicon and copper, elemental copper, and the like. Furthermore, material layer 66 can be a dielectric material, such as silicon dioxide, silicon nitride, silicon oxynitride, boron oxynitride, and the like.

In practicing the present invention, where material layer 66 is a semiconductor material, halogen and halogenated processing gases, such as chlorine, hydrogen chloride, chlorinated halocarbons, fluorine and fluorinated compounds, chlorofluorocarbons, bromine, hydrogen bromide, iodine, hydrogen iodide, and the like, and mixtures thereof can be used to etch the material. Also, where material layer 66 is a dielectric material, fluorine, hydrogen fluoride, fluorinated halocarbons, and the like, and mixtures thereof, can be used to etch the material. Where material layer 66 is a conductive material, processing gases can include fluorinated compounds together with chlorine and chlorinated boron compounds.

Figure 6:
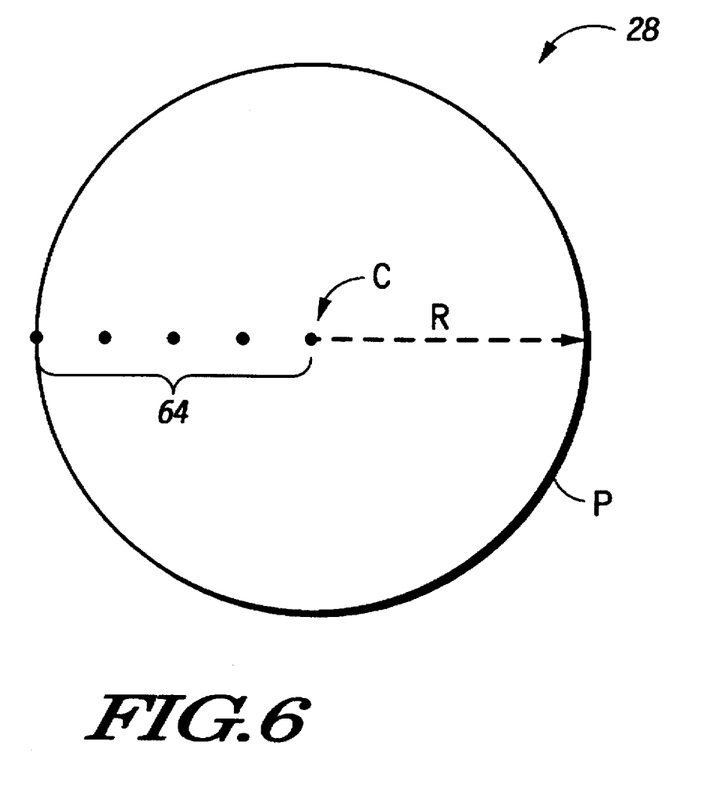
FIG. 6 illustrates a top view of a generalized depiction of a semiconductor wafer.

To carry out the etching of material layer 66, semiconductor wafer 28 is positioned on chuck 14 of ICP reactor 10 in such a manner that the center point, denoted "C" in FIGS. 6 and 7, is approximately vertically aligned with central channel 38 in plasma source 16. Upon the positional alignment of semiconductor wafer 28 with the concentric channels of plasma source 16, the localized etch rate at location 64 across semiconductor substrate 28 can be independently controlled by the spatially variant plasma conditions generated by plasma source 16. In this manner, radial control of the etch rate of material layer 66 is attained, such that material layer 66 in proximity to the perimeter P is etched simultaneously with portions of material layer 66 at center point C, and at the various location 64 across semiconductor wafer 28.

In the case of plasma deposition, a material layer, such as material layer 66, is deposited onto semiconductor wafer 28. For deposition, processing gases are introduced into processing chamber 12 from gas supply system 20 that will undergo a plasma induced reaction and form a thin-film layer on semiconductor wafer 28. For example, where a semiconductor material, such as polycrystalline silicon is to be deposited, a silicon-containing gas, such as silane, or halogenated silane, such as dichlorosilane, is introduced. Where a dielectric material, such as silicon dioxide or silicon nitride is to be deposited, a processing gas such as tetraethylorthosilane (TEOS), halogenated silane and ammonia, and the like, can be introduced. Furthermore, a refractory metal, or a refractory metal silicide material, and the like can be deposited by introducing a refractory-metal-containing gas.

Those skilled in the art will appreciate that the foregoing is only a representative description of many different processing gases that can be utilized by the present invention to either etch or deposit a material layer in ICP reactor 10. The present invention contemplates the deposition and etching of any and all materials capable of being formed in an ICP reactor.

To carry out the deposition of material layer 66, semiconductor wafer 28 is positioned on chuck 14 of ICP reactor 10 in such a manner that the center point, denoted "C" in FIGS. 6 and 7, is approximately vertically aligned with central channel 38 in plasma source 16. Upon the positional alignment of semiconductor wafer 28 with the concentric channels of plasma source 16, the localized deposition rate at locations 64 across semiconductor substrate 28 can be independently controlled by the spatially variant plasma conditions generated by plasma source 16. In this manner, radial control of the deposition rate of material layer 66 is attained, such that portions of material layer 66 in proximity to the perimeter P are formed simultaneously with portions of material layer 66 at center point C, and at the various location 64 across semiconductor wafer 28.

It is believed that one of skill in the art, can without further elaboration, practice the present invention and fully realize the operational advantages of the present invention.

Accordingly, the following examples are intended to be merely illustrative of the invention, and to not limit the invention in any way whatsoever.

EXAMPLE I

Semiconductor substrate 28 is first subjected to a chemical vapor deposition process to deposit a material layer 66 thereon. Semiconductor substrate 28 is then placed on chuck 14 in ICP reactor 10. Processing gas is selected depending upon the composition of the material layer to be etched. For example, where material layer 66 is polycrystalline silicon, halogen gases, such as chlorine, and hydrogenated halogen gases, such as hydrogen chloride and hydrogen bromide, are introduced together with an inert gas diluent. The total gas flow from gas supply system 20 is adjusted to a value of between 40 and 200 sccm and vacuum system 22 is adjusted to achieve a processing pressure of about 1 to 10 millitorr in processing chamber 12. RF power is then applied from RF power supply system 18 to RF coils 54 and 56 in plasma source 16. Preferably, about 100 to 5000 watts RF is applied to RF coils 54 and 56. Further, about 0 to 5000 watts RF is applied to chuck 14 from RF bias power supply 32. The plasma etching of the material layer is then carried out to completion.

EXAMPLE II

Semiconductor substrate 28 is placed on chuck 14 in ICP reactor 10. Processing gas is selected depending upon the composition of the material layer to deposited. For example, where material layer 66 is epitaxial silicon, hydrogen and silane are introduced in processing chamber 12 at about a 3:1 flow ratio. The total gas flow from gas supply system 20 is adjusted to a value of about 40 sccm and vacuum system 22 is adjusted to achieve a processing pressure of about 1 to 25 millitorr in processing chamber 12. RF power is then applied from RF power supply system 18 to RF coils 54 and 56 in plasma source 16. Preferably, about 500 to 1500 watts RF is applied to RF coils 54 and 56 at a frequency of about 13.56 MHz. Further, about 0 to −60 volts DC is applied to chuck 14 while maintaining chuck 14 at a temperature of about 400° to 700° C. The plasma deposition of the material layer is then carried out to completion.

Thus it is apparent that there has been provided, in accordance with the invention, an inductively coupled plasma reactor and a process for etching a material layer, which fully meet the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the present invention contemplates the etching of material layers having a lithographic pattern previously defined for the purpose of creating various device structures, such as gate electrodes, electrical contacts, electrical interconnects, and the like. Furthermore, the invention contemplates the use of many different kinds of chemical agents for the deposition or etching of a wide variety of materials used to form thin-film layers in semiconductor devices. It is therefore intended to include within the invention all such variations and modifications as fall within the scope of the appended claims and equivalents thereof.

We claim:

1. A process for fabricating a semiconductor device comprising the steps of:

providing a coaxial multiple coil inductive coupled plasma reactor having;

a reaction chamber;

a chuck positioned in the reaction chamber and configured for accepting and supporting a semiconductor wafer on a surface thereof;

a plasma source mounted within the reaction chamber in spaced relationship with the chuck, the plasma source including a plurality of channels, each channel having a gas orifice opening thereto, a gas plenum, and an RF coil surrounding the channel, wherein each gas orifice provides a passage between the channel and the gas plenum and the plurality of channels are arranged concentrically about a central axis perpendicular to the surface of the chuck;

independent gas supply lines attached to each gas orifice; and a gas control system capable of independently charging each gas supply line with a plasma-forming gas, such that a gas composition and a gas flow rate of the plasma-forming gas in each gas supply line can be independently varied;

placing a semiconductor wafer on the chuck, the semiconductor wafer having a material layer to be etched:

actuating the gas control system to charge the plasma reactor with plasma-forming gas;

applying RF power to the RF coils and igniting a plasma in the reaction chamber:

etching the material layer, wherein the etching is characterized by an etching uniformity; and controlling the etching uniformity by adjusting the gas flow rate and the gas composition.

2. The process of claim 1, further comprising applying RF power to the chuck to provide an RF bias voltage between the semiconductor wafer and the plasma.

3. A process for fabricating a semiconductor device comprising the steps of:

providing a semiconductor wafer characterized by a radius and a perimeter, the semiconductor wafer having a surface, wherein the surface is characterized by a plurality of locations on the surface, each location specified by a radial distance varying from zero to the radial distance of the perimeter of the semiconductor wafer;

forming a material layer on the surface;

placing the semiconductor wafer in an inductively coupled plasma reactor, the plasma reactor having a plasma source including a plurality of concentric channels therein, wherein each channel is independently powered by an RF coil surrounding the channel;

introducing reactive gas to each channel, wherein the reactive gas is characterized by a gas flow rate and a gas composition supplying RF power to each RF coil to produce an RF power density in each channel; and etching the material layer, while controlling the etch rate of the material layer at each location on the semiconductor wafer by independently varying the gas flow rate and gas composition of the reactive gas and the RF power density.

4. The process of claim 3, wherein the material layer is a semiconductor material and the reactive gas comprises at least one species selected from the group consisting of a halogen and a halogenated compound.

5. The process of claim 3, wherein the material layer is a conductive material and the reactive gas comprises at least one species selected from the group consisting of chlorine and a chlorinated compound.

6. The process of claim 3, wherein the material layer is a dielectric material and the reactive gas comprises at least one species selected from the group consisting of fluorine and a fluorinated compound.

7. A process for fabricating a semiconductor device comprising the steps of:

providing a coaxial multiple coil inductive coupled plasma reactor having:

a reaction chamber;

a chuck positioned in the reaction chamber and configured for accepting and supporting a semiconductor wafer on a surface thereof;

a plasma source molted within the reaction chamber in spaced relationship with the chuck, the plasma source including a plurality of channels, each channel having a gas orifice opening thereto, a gas plenum, and an RF coil surrounding the channel, wherein each gas orifice provides a passage between the channel and the gas plenum and the plurality of channels are arranged concentrically about a central axis perpendicular to the surface of the chuck;

independent gas supply lines attached to each gas orifice; and a gas control system capable of independently charging each gas supply line with a plasma-forming gas, such that a gas composition and a flow rate of the plasma-forming gas in each gas supply line can be independently varied;

placing a semiconductor wafer on the chuck;

actuating the gas control system to charge the plasma reactor with plasma-forming gas;

applying RF power to the RF coils and igniting a plasma in the reaction chamber;

depositing a material layer onto the semiconductor wafer, wherein the deposition is characterized by a deposition uniformity; and controlling the deposition uniformity by adjusting the gas flow rate and the gas composition emerging from the plurality of channels and by controlling the RF power density in each channel.

8. A process for fabricating a semiconductor device comprising the steps of:

providing a semiconductor wafer characterized by a radius and a perimeter, the semiconductor wafer having a surface, wherein the surface is characterized by a plurality of locations on the surface, each location specified by a radial distance varying from zero to the radial distance of the perimeter of the semiconductor wafer;

placing the semiconductor wafer in an inductively coupled plasma reactor, the plasma reactor having a plasma source including a plurality of concentric channels therein, wherein each channel is independently powered by an RF coil surrounding the channel;

introducing reactive gas to each channel, wherein the reactive gas is characterized by a gas flow rate and gas composition supplying RF power to each RF coil to produce an RF power density in each channel; and processing the semiconductor wafer, while controlling the plasma conditions at each location on the semiconductor wafer by independently varying the gas flow rate and gas composition of the reactive gas and the RF power density in each channel.

9. The process of claim 8, wherein the step of processing the semiconductor wafer comprises etching a material layer overlying the semiconductor wafer.

10. The process of claim 8, wherein the step of processing the semiconductor wafer comprises depositing a material layer onto the semiconductor wafer.

11. A process for fabricating a semiconductor device comprising the steps of:

providing a plasma reactor, the plasma reactor having a first plasma generation region and a second plasma generation region, the first plasma generation region having a perimeter wherein the second plasma generation region surrounds the perimeter of the first plasma generation region;

placing a semiconductor substrate within the plasma reactor;

using the first plasma generation region and the second plasma generation region to generate a plasma within the plasma reactor; and processing the semiconductor substrate in the plasma reactor using the plasma.

12. The process of claim 11, wherein the step of providing the plasma reactor is further characterized as providing an inductively coupled plasma reactor.

13. The process of claim 11, wherein the step of providing the plasma reactor the first plasma generation region and the second plasma generation region are further characterized as being concentric.

14. The process of claim 11, wherein the step of providing the plasma reactor comprises providing a plasma reactor wherein the first plasma generation region is further characterized as comprising a first channel region surrounded by a first coil and the second plasma generation region is further characterized as comprising a second channel region surrounded by a second coil.

15. The process of claim 11, wherein the step of providing the plasma reactor comprises providing a plasma reactor wherein the first plasma generation region is further characterized as having a first gas supply and the second plasma generation region is further characterized as having second gas supply, wherein the first gas supply has a first gas flow rate and a first gas composition and the second gas supply has a second gas flow rate and a second gas composition.

16. The process of claim 15, wherein the step of processing the semiconductor substrate the first gas flow rate is not equal to the second gas flow rate.

17. The process of claim 15, wherein the step of processing the semiconductor substrate the first gas composition is different from the second gas composition.

18. The process of claim 11, wherein the step of processing the semiconductor substrate is further characterized as etching a layer of material on the semiconductor substrate.

19. The process of claim 11, wherein the step of processing the semiconductor substrate is further characterized as depositing a layer of material on the semiconductor substrate.

20. The process of claim 11, wherein the step of providing the plasma reactor comprises providing a plasma reactor wherein the first plasma generation region is further characterized as being powered by a first power supply and the second plasma generation region is further characterized as being powered by a second power supply, the first power supply supplying a first power to the first plasma generation region and the second power supply supplying a second power to the second plasma generation region.

21. The process of claim 20, wherein the step of processing the semiconductor substrate the first power is not equal to the second power.

22. A coaxial multiple coil inductive coupled plasma reactor comprising:

a reaction chamber;

a chuck positioned in the reaction chamber and configured for accepting and supporting a semiconductor wafer on a surface thereof;

a plasma source mounted within the reaction chamber in spaced relationship with the chuck, the plasma source including a plurality of channels, each channel having a gas orifice opening thereto, a gas plenum, and an RF coil surrounding the channel, wherein each gas orifice provides a passage between the channel and the gas plenum and the plurality of channels are arranged concentrically about a central axis perpendicular to the surface of the chuck;

a dielectric material separating the RF coil from the channel;

independent gas supply lines attached to each gas plenum; and a gas control system capable of independently charging each gas supply line with a plasma-forming gas, such that a gas composition and a gas flow rate of the plasma-forming gas in each gas supply line can be independently varied.

23. The plasma reactor of claim 11, wherein the plurality of channels is further characterized as a central channel in alignment with the central axis and at least one peripheral channel surrounding the central channel.

24. The plasma reactor of claim 23, wherein the plasma source is separated from the chuck by a separation distance, and wherein the separation distance between the central channel and the chuck is less than the separation distance between the peripheral channel and the chuck.

25. The plasma reactor of claim 23, wherein the plasma source is separated from the chuck by a separation distance, and wherein the separation distance between the central channel and the chuck is greater than the separation distance between the peripheral channel and the chuck.

26. The plasma reactor of claim 22 further comprising an RF shield surrounding each coil and positioned opposite to the dielectric material.

27. The plasma reactor of claim 26, wherein the RF shield comprises a ferromagnetic material.

28. The plasma reactor of claim 26, wherein the RF shield comprises aluminum.

* * * * *

UNITED STATES PATENT AND TRADEMARK OFFICE
CERTIFICATE OF CORRECTION

PATENT NO: 5,683,548

DATED: November 4, 1997

INVENTORS: Michael J. Hartig; John C. Arnold

It is certified that error appears in the above-identified patent and that said Letters Patent is hereby corrected as shown below:

Column 9, line 20, change "molted" to --mounted--

Signed and Sealed this

Seventh Day of April, 1998

Attest:

BRUCE LEHMAN

Attesting Officer

Commissioner of Patents and Trademarks

EX PARTE REEXAMINATION CERTIFICATE (5722nd)

United States Patent
Hartig et al.

(10) Number: US 5,683,548 C1
(45) Certificate Issued: Mar. 27, 2007

(54) INDUCTIVELY COUPLED PLASMA REACTOR AND PROCESS

(75) Inventors: Michael J. Hartig, Austin, TX (US); John C. Arnold, Austin, TX (US)

(73) Assignee: Freescale Semiconductor, Inc., Austin, TX (US)

Reexamination Request:
No. 90/006,926, Jan. 28, 2004

Reexamination Certificate for:
Patent No.: 5,683,548
Issued: Nov. 4, 1997
Appl. No.: 08/605,697
Filed: Feb. 22, 1996

Certificate of Correction issued Apr. 7, 1998.

(51) Int. Cl.
*H05H 1/00* (2006.01)

(52) U.S. Cl. .......................... 438/729; 438/9; 438/710; 438/711; 438/715; 438/733; 438/935; 156/345.24; 156/345.29; 156/345.33; 156/345.38; 156/345.48; 156/345.52; 156/345.53; 427/569; 118/723 I; 118/723 IR (58) Field of Classification Search ................ None
See application file for complete search history.

(56) References Cited

U.S. PATENT DOCUMENTS

| | | | |
|---|---|---|---|
| 3,890,535 A | 6/1975 | Gautherin et al. | |
| 4,394,400 A | 7/1983 | Green et al. | |
| 4,638,216 A | 1/1987 | Delaunay et al. | |
| 4,885,068 A | 12/1989 | Uramoto et al. | |
| 4,894,510 A | * 1/1990 | Nakanishi et al. | 219/121.43 |
| 5,016,564 A | 5/1991 | Nakamura et al. | |
| 5,017,404 A | 5/1991 | Paquet et al. | |
| 5,017,835 A | 5/1991 | Oechsner | |
| 5,032,202 A | 7/1991 | Tsai et al. | |
| 5,134,965 A | 8/1992 | Tokuda et al. | |
| 5,241,245 A | 8/1993 | Barnes et al. | |
| 5,285,046 A | 2/1994 | Hansz | |
| 5,292,370 A | 3/1994 | Tsai et al. | |
| 5,346,578 A | 9/1994 | Benzing et al. | |
| 5,356,515 A | 10/1994 | Tahara et al. | |
| 5,401,350 A | 3/1995 | Patrick et al. | |
| 5,662,819 A | * 9/1997 | Kadomura | 438/711 |
| 5,907,221 A | 5/1999 | Sato et al. | |
| 6,077,384 A | * 6/2000 | Collins et al. | 156/345.29 |

FOREIGN PATENT DOCUMENTS

| | | |
|---|---|---|
| EP | 0 766 309 A1 | 1/1997 |
| EP | 0 650 183 B1 | 4/1998 |
| EP | 0 648 069 B1 | 10/1999 |
| JP | 57-166028 | 10/1982 |
| JP | 62-114230 | 5/1987 |
| JP | 01-184921 | 7/1989 |
| JP | 03-094422 | 4/1991 |
| JP | 07-135093 | 5/1995 |

OTHER PUBLICATIONS

US 5,237,958, 8/1993, Dalvie et al. (withdrawn)

European Search Report mailed Feb. 25, 1999 for EP Application 97102279.

(Continued)

*Primary Examiner*—Anita Alanko (57) ABSTRACT

An inductively coupled plasma reactor and method for processing a semiconductor wafer (28). The inductively coupled plasma reactor (10) includes a plasma source (16) having a plurality of channels (38, 44) in which processing gases are independently supplied to each channel. A gas supply system (20) includes a plurality of gas feed lines (34, 35, 36) each capable of supplying an individual flow rate and gas composition to the plurality of channels (38, 44) in the plasma source (16). Each channel is surrounded by an independently powered RF coil (54, 56), such that the plasma density can be varied within each channel (38, 44) of the plasma source (16). In operation, a material layer (66) overlying a semiconductor wafer (28) is either uniformly etched or deposited by localized spatial control of the plasma characteristics at each location (64) across the semiconductor wafer (28).

OTHER PUBLICATIONS

Keller, John H.; "Inductive plasmas for plasma processing"; Plasma Sources Science Technology 5; 1996; pp. 166–172; IOP Publishing Co; UK.

Cardinaud, C.; "ICP reactors for plasma processing"; Le Vide; 1999; pp. 20–40; No. 291–1/4–1999.

Ventzek, Peter L.G. et al.. "Investigation of electron source and ion flux uniformity in high plasma density inductively couples etching tools using two–dimensional modeling"; J. Vac. Sci. Technol.; Nov./Dec. 1994; pp. 3118–3134; B(12)6; American Vacuum Society.

Li, Y. M.; "Analytic Models of Inductively Coupled Discharges"; IEEE International Conference on Plasma; 1993; p. 219; IEEE Conference Record Abstracts.

Youtsos, A. et al.; "Eddy current heating analysis of the ITER TF coil cases"; Fusion Engineering and Design 19; 1992; pp. 73–92; Elsevier Science Publishers B.V.

Getty, Ward D. et al.; "Size–scalable, 2.45–GHz electron cyclotron resonance plasma source using permanent magnets and waveguide coupling"; J. Vac. Sci. Technol.; Jan./Feb. 1994; pp. 408–415; B 12(1); American Vacuum Society.

EPO Office Action mailed May 14, 2004.

Yamada et al., "Simulations of Real–Time Two–Coil Control of an Inductively Coupled Plasma for Etching Applications," *Electrochemical Society Proceedings,* 1995, vol. 95–4, pp. 575–587.

* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 12, 14 and 23 are cancelled.

Claims 1, 3, 7, 8, 11 and 22 are determined to be patentable as amended.

Claims 2, 4–6, 9, 10, 13, 15–21 and 24–28, dependent on an amended claim, are determined to be patentable.

New claims 29–61 are added and determined to be patentable.

1. A process for fabricating a semiconductor device comprising the steps of:
    providing a coaxial multiple coil inductive coupled plasma reactor having;
    a reaction chamber;
    a chuck positioned in the reaction chamber and configured for accepting and supporting a semiconductor wafer on a surface thereof;
    a plasma source mounted within the reaction chamber in spaced relationship with the chuck, the plasma source including a plurality of channels, each channel having a gas orifice opening thereto, a gas plenum, and an RF coil surrounding the channel,
    wherein each gas orifice provides a passage between the channel and the gas plenum and the plurality of channels are arranged concentrically about a central axis perpendicular to the surface of the chuck;
    independent gas supply lines attached to each gas orifice; and
    a gas control system capable of independently charging each gas supply line with a plasma-forming gas, such that a gas composition and a gas flow rate of the plasma-forming gas in each gas supply line can be independently varied;
    placing a semiconductor wafer on the chuck, the semiconductor wafer having a material layer to be etched;
    actuating the gas control system to charge the plasma reactor with plasma-forming gas;
    applying RF power to the RF coils and igniting a plasma in the reaction chamber;
    etching the material layer,
    wherein the etching is characterized by an etching uniformity; and
    controlling the etching uniformity by adjusting the gas flow rate and the gas composition;
    *wherein the plurality of channels includes a first channel and a second channel, the second channel surrounding the first channel.*

3. A process for fabricating a semiconductor device comprising the steps of:
    providing a semiconductor wafer characterized by a radius and a perimeter, the semiconductor wafer having a surface,
    wherein the surface is characterized by a plurality of locations on the surface, each location specified by a radial distance varying from zero to the radial distance of the perimeter of the semiconductor wafer;
    forming a material layer on the surface;
    placing the semiconductor wafer in an inductively coupled plasma reactor, the plasma reactor having a plasma source including a plurality of concentric channels therein,
    wherein each channel is independently powered by an RF coil surrounding the channel;
    introducing reactive gas to each channel,
    wherein the reactive gas is characterized by a gas flow rate and a gas composition
    supplying RF power to each RF coil to produce an RF power density in each channel; and
    etching the material layer, while controlling the etch rate of the material layer at each location on the semiconductor wafer by independently varying the gas flow rate and gas composition of the reactive gas and the RF power density;
    *igniting a plasma in each of the plurality of channels.*

7. A process for fabricating a semiconductor device comprising the steps of:
    providing a coaxial multiple coil inductive coupled plasma reactor having:
    a reaction chamber;
    a chuck positioned in the reaction chamber and configured for accepting and supporting a semiconductor wafer on a surface thereof;
    a plasma source mounted within the reaction chamber in spaced relationship with the chuck, the plasma source including a plurality of channels, each channel having a gas orifice opening thereto, a gas plenum, and an RF coil surrounding the channel,
    wherein each gas orifice provides a passage between the channel and the gas plenum and the plurality of channels are arranged concentrically about a central axis perpendicular to the surface of the chuck;
    independent gas supply lines attached to each gas orifice; and
    a gas control system capable of independently charging each gas supply line with a plasma-forming gas, such that a gas composition and a flow rate of the plasma-forming gas in each gas supply line can be independently varied;
    placing a semiconductor wafer on the chuck;
    actuating the gas control system to charge the plasma reactor with plasma-forming gas;
    applying RF power to the RF coils and igniting a plasma in the reaction chamber;
    depositing a material layer onto the semiconductor wafer, wherein the deposition is characterized by a deposition uniformity; and controlling the deposition uniformity by adjusting the gas flow rate and the gas composition emerging from the plurality of channels and by controlling the RF power density in each channel;

*igniting a plasma in each of the plurality of channels.*

8. A process for fabricating a semiconductor device comprising the steps of:

providing a semiconductor wafer characterized by a radius and a perimeter, the semiconductor wafer having a surface, wherein the surface is characterized by a plurality of locations on the surface, each location specified by a radial distance varying from zero to the radial distance of the perimeter of the semiconductor wafer;

placing the semiconductor wafer in an inductively coupled plasma reactor, the plasma reactor having a plasma source including a plurality of concentric channels therein, wherein each channel is independently powered by an RF coil surrounding the channel;

introducing reactive gas to each channel, wherein the reactive gas is characterized by a gas flow rate and gas composition supplying RF power to each RF coil to produce an RF power density in each channel; and processing the semiconductor wafer, while controlling the plasma conditions at each location on the semiconductor wafer by independently varying the gas flow rate and gas composition of the reactive gas and the RF power density in each channel;

*wherein the plurality of channels includes a first channel and a second channel, the second channel surrounding the first channel.*

11. A process for fabricating a semiconductor device comprising the steps of:

providing a plasma reactor, the plasma reactor having a first plasma generation region and a second plasma generation region, the first plasma generation region having a perimeter wherein the second plasma generation region surrounds the perimeter of the first plasma generation region, *wherein the step of providing the plasma reactor is further characterized as providing an inductively coupled plasma reactor*;

placing a semiconductor substrate within the plasma reactor;

using the first plasma generation region and the second plasma generation region to generate a plasma within the plasma reactor; and processing the semiconductor substrate in the plasma reactor using the plasma;

*wherein the step of using the first plasma generation region and the second plasma generation region to generate a plasma within the plasma reactor further includes supplying power to a first solenoid coil associated with the first plasma generation region and supplying power to a second solenoid coil associated with the second plasma generation region;*

*wherein the step of providing the plasma reactor comprises providing a plasma reactor wherein the first plasma generation region is further characterized as comprising a first channel region surrounded by the first coil and the second plasma generation region is further characterized as comprising a second channel region surrounded by the second solenoid coil;*

*wherein the second channel region surrounds the first channel region.*

22. A coaxial multiple coil inductive coupled plasma reactor comprising:

a reaction chamber;

a chuck positioned in the reaction chamber and configured for accepting and supporting a semiconductor wafer on a surface thereof;

a plasma source mounted within the reaction chamber in spaced relationship with the chuck, the plasma source including a plurality of channels, each channel having a gas orifice opening thereto, a gas plenum, and an RF coil surrounding the channel, wherein each gas orifice provides a passage between the channel and the gas plenum and the plurality of channels are arranged concentrically about a central axis perpendicular to the surface of the chuck;

a dielectric material separating the RF coil from the channel;

independent gas supply lines attached to each gas plenum; and a gas control system capable of independently charging each gas supply line with a plasma-forming gas, such that a gas composition and a gas flow rate of the plasma-forming gas in each gas supply line can be independently varied;

*wherein the plurality of channels is further characterized as a central channel in alignment with the central axis and at least one peripheral channel surrounding the central channel.*

29. The process of claim 11 wherein:

wherein the step of supplying power to the first solenoid coil includes supplying current to the first solenoid coil, wherein the current supplied to the first solenoid coil inductively couples with processing gas to generate a plasma in the first plasma generation region;

wherein the step of supplying power to the second solenoid coil includes supplying current to the second solenoid coil, wherein the current supplied to the second solenoid coil inductively couples with processing gas to generate a plasma in the second plasma generation region.

30. The process of claim 11 wherein the first solenoid coil is a coaxial coil and the second solenoid coil is a coaxial coil.

31. The process of claim 11 wherein the step of supplying power to a first solenoid coil includes supplying power to the first solenoid coil at a first frequency while supplying power to the second solenoid coil at a second frequency, the second frequency being different from the first frequency.

32. The process of claim 11 wherein the step of supplying power to a first solenoid coil includes supplying power to the first solenoid coil at a first power level while supplying power to the second solenoid coil at a second power level, the second power level being different from the first power level.

33. The process of claim 11 wherein:

a dielectric material is located between the semiconductor substrate and the first solenoid coil;

a dielectric material is located between the semiconductor substrate and the second solenoid coil.

34. The process of claim 11 wherein the first solenoid coil and the second solenoid coil are independently controllable.

35. The process of claim 11 wherein a dielectric material is located between the first solenoid coil and the plasma and a dielectric material is located between the second solenoid coil and the plasma.

36. The method of claim 11 wherein:
wherein an power density for generating plasma in the first plasma generation region is controllable by controlling the power supplied to the first solenoid coil;
wherein an power density for generating plasma in the second plasma generation region is controllable by controlling the power supplied to the second solenoid coil.

37. The process of claim 11 wherein a first power supply generator supplies power to the first solenoid coil and a second power supply generator supplies power to the second solenoid coil.

38. The process of claim 11 further comprising:
supporting the semiconductor substrate with a chuck;
providing a cooling liquid through a channel in the chuck during the processing of the semiconductor substrate.

39. The process of claim 11 further comprising:
supporting the semiconductor substrate with a chuck;
providing a cooling gas through a channel in the chuck during the processing of the semiconductor substrate.

40. The process of claim 11 wherein the plasma reactor includes an shield surrounding the second solenoid coil.

41. The process of claim 11 wherein the second solenoid coil is located around the first solenoid coil.

42. The process of claim 11 wherein the second solenoid coil is characterized as being concentric about the first solenoid coil.

43. A process for fabricating a semiconductor device comprising the steps of:
providing a plasma reactor, the plasma reactor having a first plasma generation region and a second plasma generation region, the first plasma generation region having a perimeter wherein the second plasma generation region surrounds the perimeter of the first plasma generation region;
placing a semiconductor substrate within the plasma reactor;
using the first plasma generation region and the second plasma generation region to generate a plasma wihin the plasma reactor; and
processing the semiconductor substrate in the plasma reactor using the plasma;
wherein the plasma generator includes a first solenoid coil and a second solenoid coil;
wherein the step of using the first plasma generation region and the second plasma generation region to generate a plasma within the plasma reactor further includes supplying power to the first solenoid coil and supplying power to the second solenoid coil;
wherein the step of supplying power to the first solenoid coil includes supplying current to the first solenoid coil, wherein the current supplied to the first coil inductively couples with processing gas to generate a plasma in the first plasma generation region including in a first channel region;
wherein the step of supplying power to the second solenoid coil includes supplying current to the second solenoid coil, wherein the current supplied to the second solenoid coil inductively couples with processing gas to generate a plasma in the second plasma generation region including in a second channel region;
wherein the step of providing the plasma reactor comprises providing a plasma reactor wherein the first plasma generation region is further characterized as comprising a first channel region surrounded by the first coil and the second plasma generation region is further characterized as comprising a second channel region surrounded by the second solenoid coil;
wherein the second channel region surrounds the first channel region.

44. The process of claim 43 wherein the second solenoid coil is located around the first solenoid coil.

45. The process of claim 43 wherein the second solenoid coil is characterized as being concentric about the first solenoid coil.

46. A process for fabricating a semiconductor device comprising the steps of:
providing a plasma reactor, the plasma reactor having a first plasma generation region and a second plasma generation region, the first plasma generation region having a perimeter wherein the second plasma generation region surrounds the perimeter of the first plasma generation region wherein the step of providing the plasma reactor is further characterized as providing an inductively coupled plasma reactor;
placing a semiconductor substrate within the plasma reactor;
using the first plasma generation region and the second plasma generation region to generate a plasma within the plasma reactor; and
processing the semiconductor substrate in the plasma reactor using the plasma,
wherein the step of using the first plasma generation region and the second plasma generation region to generate a plasma within the plasma reactor further includes supplying the RF power to a first solenoid RF coil to generate an RF power density in the first plasma generation region and supplying RF power to the second solenoid RF coil to generate an RF power density in the second plasma generation region
wherein the semiconductor substrate is located in a first plane, wherein the first solenoid RF coil is vertically separated from the first plane by a first distance and the second solenoid RF coil is vertically separated from the first plane by a second distance, the second distance is different from the first distance.

47. The process of claim 46 wherein the step of supplying RF power to a first solenoid RF coil includes supplying RF power to the first solenoid RF coil at a first frequency while supplying RF power to the second solenoid RF coil at a second frequency, the second frequency being different from the first frequency.

48. The process of claim 46 wherein the first solenoid RF coil and the second solenoid RF coil are independently controllable.

49. A process for fabricating a semiconductor device comprising the steps of:
providing a plasma reactor, the plasma reactor having a first plasma generation region and a second plasma generation region, the first plasma generation region having a perimeter wherein the second plasma generation region surrounds the perimeter of the first plasma generation region, wherein the step of providing the plasma reactor is further characterized as providing an inductively coupled plasma reactor;
placing a semiconductor substrate within the plasma reactor;
using the first plasma generation region and the second plasma generation region to generate a plasma within the plasma reactor; and processing the semiconductor substrate in the plasma reactor using the plasma;

wherein the step of using the first plasma generation region and the second plasma generation region to generate a plasma within the plasma reactor further includes supplying power to a first RF coil associated with the first plasma generation region and supplying power to a second RF coil associated with the second plasma generation region;

wherein the plasma reactor includes an shield surrounding the second RF coil wherein the RF shield comprises a ferromagnetic material.

50. The process of claim 49 wherein the first RF coil is characterized as a solenoid coil and the second RF coil is characterized as an RF coil.

51. The process of claim 11, wherein the plasma source is separated from the chuck by a separation distance, and wherein the separation distance between the first channel region and the chuck is less than the separation distance between the second channel region and the chuck.

52. The process of claim 11, wherein the plasma source is separated from the chuck by a separation distance, and wherein the separation distance between the first channel region and the chuck is greater than the separation distance between the second channel region and the chuck.

53. The process of claim 11 further comprising an RF shield surrounding each coil and positioned opposite to the dielectric material.

54. The process of claim 53, wherein the RF shield comprises a ferromagnetic material.

55. The process of claim 53, wherein the RF shield comprises aluminum.

56. The process of claim 1 further comprising:

igniting a plasma in each of the plurality of channels.

57. The process of claim 3 wherein the plurality of channels includes a first channel and a second channel, the second channel surrounding the first channel.

58. The process of claim 7 wherein the plurality of channels includes a first channel and a second channel, the second channel surrounding the first channel.

59. The process of claim 8 further comprising:

igniting a plasma in each of the plurality of channels.

60. The process of claim 46 wherein the first distance is greater than the second distance.

61. The process of claim 46 wherein the first distance is less than the second distance.

\* \* \* \* \*